(12) United States Patent
Ho et al.

(10) Patent No.: US 12,166,001 B2
(45) Date of Patent: *Dec. 10, 2024

(54) SINGLE-SHOT ENCAPSULATION

(71) Applicant: Semtech Corporation, Camarillo, CA (US)

(72) Inventors: Kok Khoon Ho, San Jose, CA (US); Jonathan Clark, Camarillo, CA (US); John MacLeod, Invergordon (GB)

(73) Assignee: Semtech Corporation, Camarillo, CA (US)

( * ) Notice: Subject to any disclaimer, the term of this patent is extended or adjusted under 35 U.S.C. 154(b) by 384 days.

This patent is subject to a terminal disclaimer.

(21) Appl. No.: 17/450,474

(22) Filed: Oct. 11, 2021

(65) Prior Publication Data
US 2022/0028813 A1 Jan. 27, 2022

Related U.S. Application Data

(60) Continuation of application No. 16/525,193, filed on Jul. 29, 2019, now Pat. No. 11,171,099, which is a
(Continued)

(51) Int. Cl.
*H01L 21/683* (2006.01)
*H01L 21/02* (2006.01)
(Continued)

(52) U.S. Cl.
CPC ........ *H01L 24/11* (2013.01); *H01L 21/02118* (2013.01); *H01L 21/561* (2013.01);
(Continued)

(58) Field of Classification Search
CPC . H01L 21/6835; H01L 21/561; H01L 23/3114
See application file for complete search history.

(56) References Cited

U.S. PATENT DOCUMENTS 9,607,973 B1 * 3/2017 Fasano ................ H01L 24/16
10,410,988 B2 * 9/2019 Ho ................ H01L 21/02118
(Continued)

FOREIGN PATENT DOCUMENTS

CN 101339910 B 6/2010
CN 104637878 A 5/2015
(Continued)

*Primary Examiner* — Dale E Page
*Assistant Examiner* — Wilner Jean Baptiste
(74) *Attorney, Agent, or Firm* — Brian M. Kaufman; Robert D. Atkins; PATENT LAW GROUP: Atkins and Associates, P.C.

(57) ABSTRACT

A semiconductor device includes a semiconductor wafer. A plurality of pillar bumps is formed over the semiconductor wafer. A solder is deposited over the pillar bumps. The semiconductor wafer is singulated into a plurality of semiconductor die after forming the pillar bumps while the semiconductor wafer is on a carrier. An encapsulant is deposited around the semiconductor die and pillar bumps while the semiconductor die remains on the carrier. The encapsulant covers an active surface of the semiconductor die between the pillar bumps.

25 Claims, 18 Drawing Sheets

Related U.S. Application Data division of application No. 15/668,969, filed on Aug. 4, 2017, now Pat. No. 10,410,988.

(60) Provisional application No. 62/372,720, filed on Aug. 9, 2016.

(51) Int. Cl.

| | | |
|---|---|---|
| *H01L 21/56* | (2006.01) | |
| *H01L 21/78* | (2006.01) | |
| *H01L 23/00* | (2006.01) | |
| *H01L 23/31* | (2006.01) | |
| *H01L 23/498* | (2006.01) | |
| *H01L 21/60* | (2006.01) | |

(52) U.S. Cl.
CPC ........ *H01L 21/568* (2013.01); *H01L 21/6835* (2013.01); *H01L 21/6836* (2013.01); *H01L 21/78* (2013.01); *H01L 23/3114* (2013.01); *H01L 23/49827* (2013.01); *H01L 24/03* (2013.01); *H01L 24/27* (2013.01); *H01L 2021/60007* (2013.01); *H01L 24/13* (2013.01); *H01L 24/81* (2013.01); *H01L 24/97* (2013.01); *H01L 2221/68327* (2013.01); *H01L 2221/6834* (2013.01); *H01L 2224/03912* (2013.01); *H01L 2224/04105* (2013.01); *H01L 2224/05548* (2013.01); *H01L 2224/05567* (2013.01); *H01L 2224/11334* (2013.01); *H01L 2224/11462* (2013.01); *H01L 2224/11464* (2013.01); *H01L 2224/1147* (2013.01); *H01L 2224/13024* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13184* (2013.01); *H01L 2224/94* (2013.01); *H01L 2224/95001* (2013.01); *H01L 2224/95136* (2013.01); *H01L 2224/97* (2013.01); *H01L 2924/1203* (2013.01); *H01L 2924/12041* (2013.01); *H01L 2924/13091* (2013.01); *H01L 2924/1431* (2013.01); *H01L 2924/1433* (2013.01); *H01L 2924/1461* (2013.01); *H01L 2924/181* (2013.01)

(56) References Cited

U.S. PATENT DOCUMENTS

| | | |
|---|---|---|
| 11,171,090 B2 * | 11/2021 | Wu .................. H01L 21/568 |
| 2009/0011543 A1 | 1/2009 | Karta et al. |
| 2011/0074026 A1 | 3/2011 | Shim et al. |
| 2011/0079902 A1 | 4/2011 | Sakamoto et al. |
| 2011/0101520 A1 | 5/2011 | Liu et al. |
| 2011/0156253 A1 | 6/2011 | Tsai et al. |
| 2011/0215458 A1 | 9/2011 | Camacho et al. |
| 2012/0061823 A1 | 3/2012 | Wu et al. |
| 2012/0104580 A1 | 5/2012 | Feng et al. |
| 2012/0220081 A1 | 8/2012 | Tsai |
| 2012/0286408 A1 | 11/2012 | Warren et al. |
| 2013/0093100 A1 | 4/2013 | Shariff et al. |
| 2015/0024550 A1 | 1/2015 | Voerckel |
| 2015/0364436 A1 | 12/2015 | Yu et al. |
| 2016/0014902 A1 | 1/2016 | Henn et al. |
| 2016/0027694 A1 | 1/2016 | Truhitte et al. |
| 2016/0049348 A1 | 2/2016 | Zhao et al. |
| 2016/0133594 A1 | 5/2016 | Huang et al. |
| 2016/0141218 A1 | 5/2016 | Horibe et al. |
| 2016/0260682 A1 | 9/2016 | Scanlan et al. |
| 2017/0263543 A1 | 9/2017 | Bang et al. |

FOREIGN PATENT DOCUMENTS

| | | |
|---|---|---|
| CN | 105374783 A | 3/2016 |
| EP | 2985787 A1 | 2/2016 |

* cited by examiner

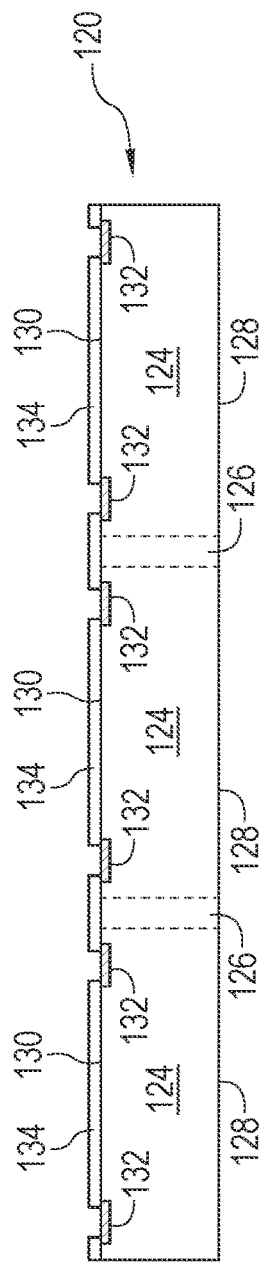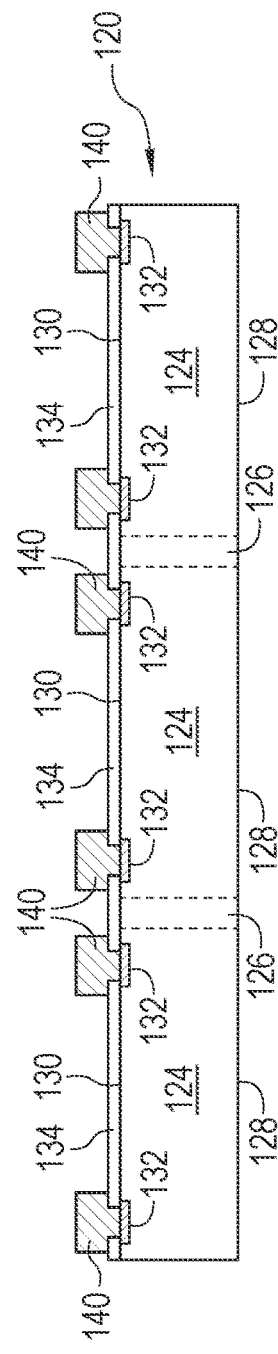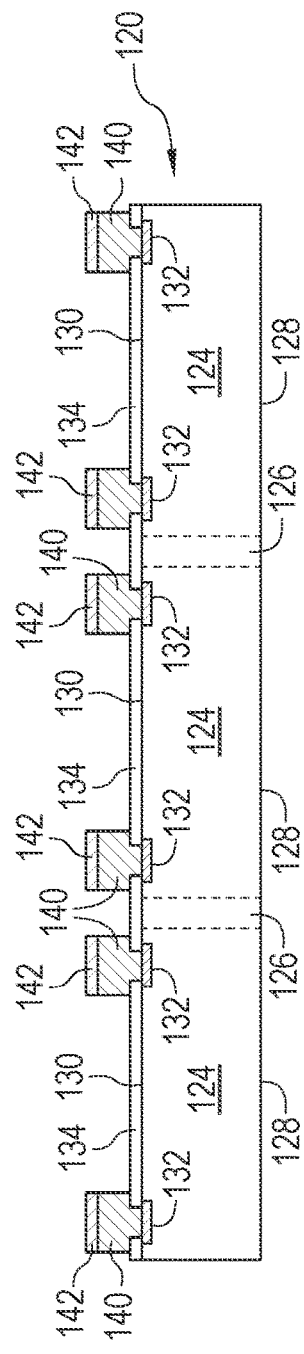

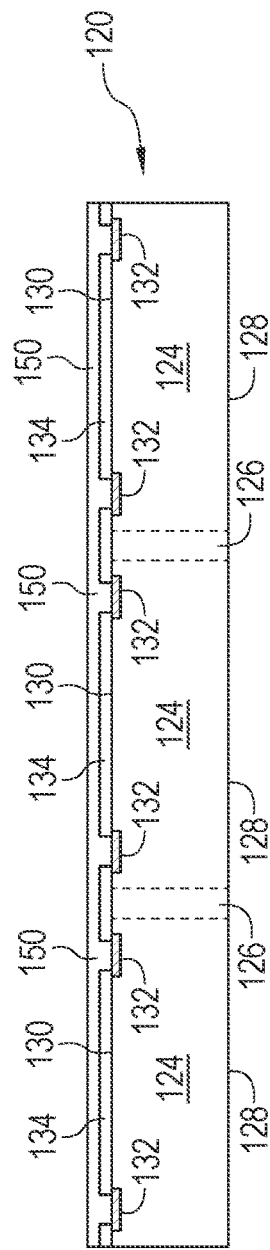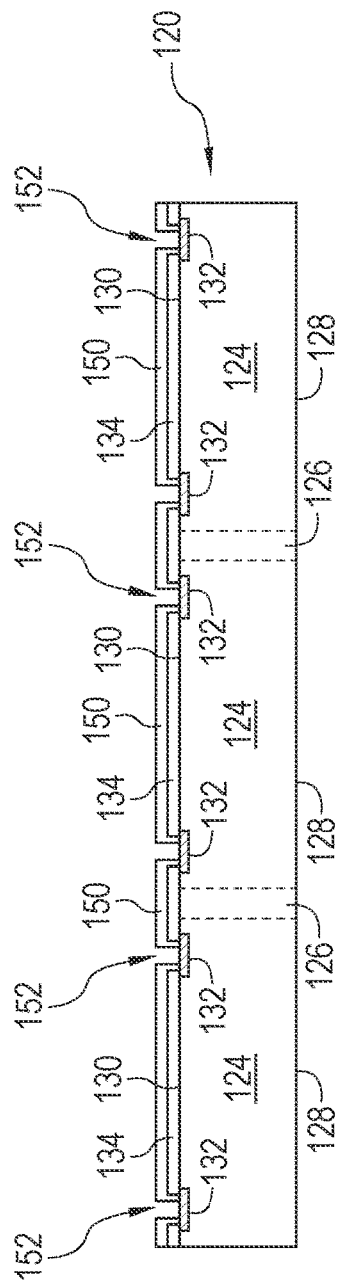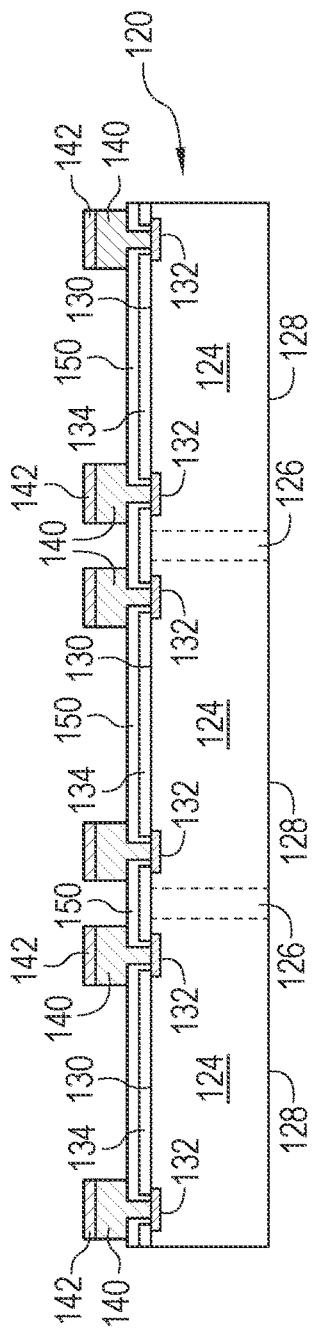

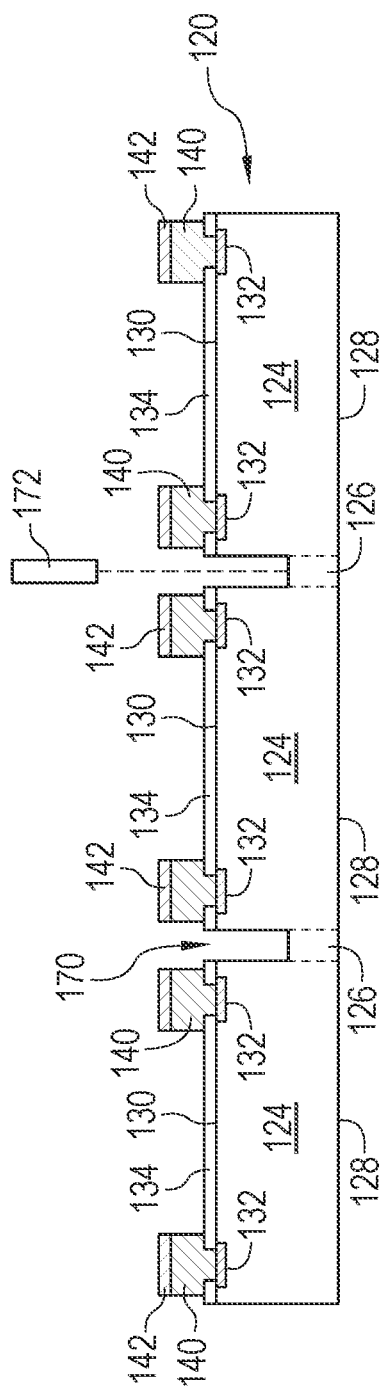
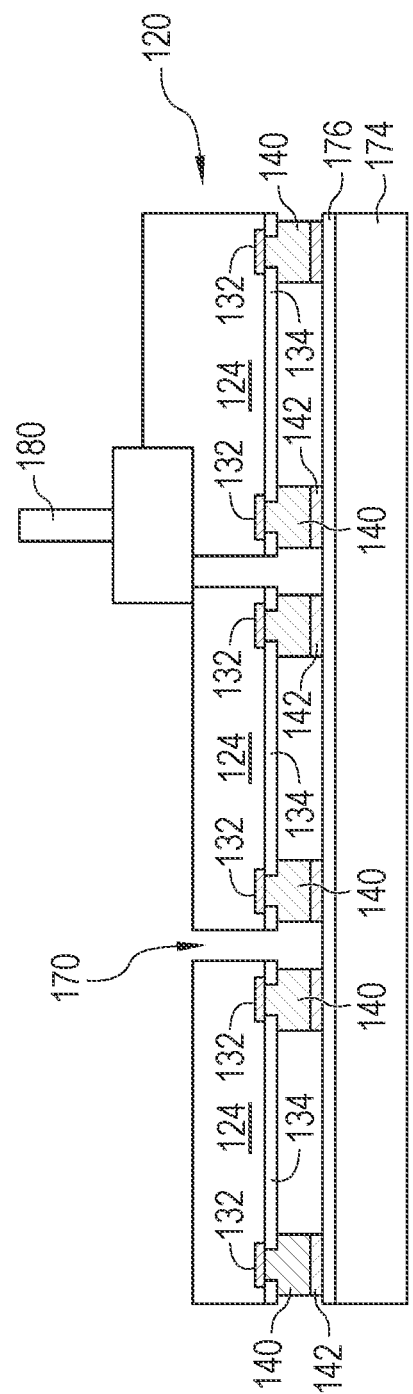
FIG. 4a
FIG. 4b

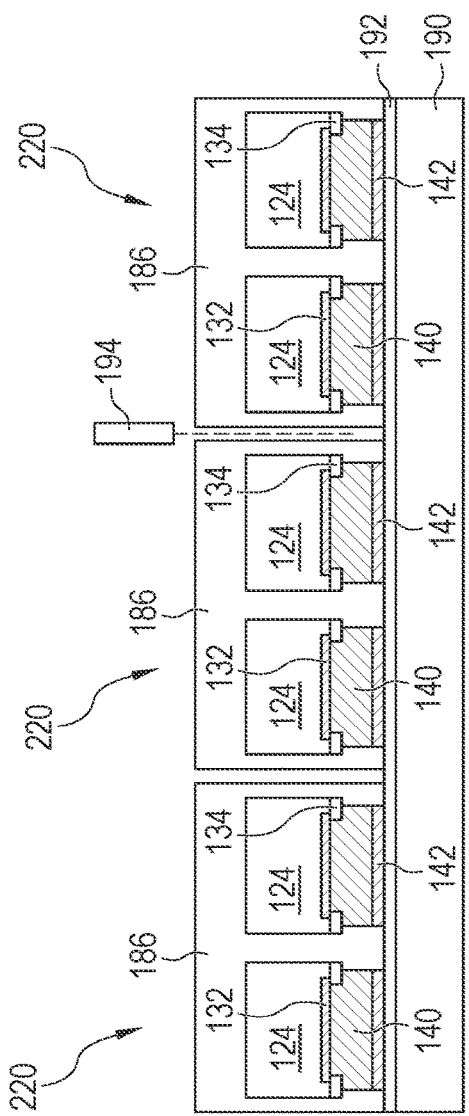
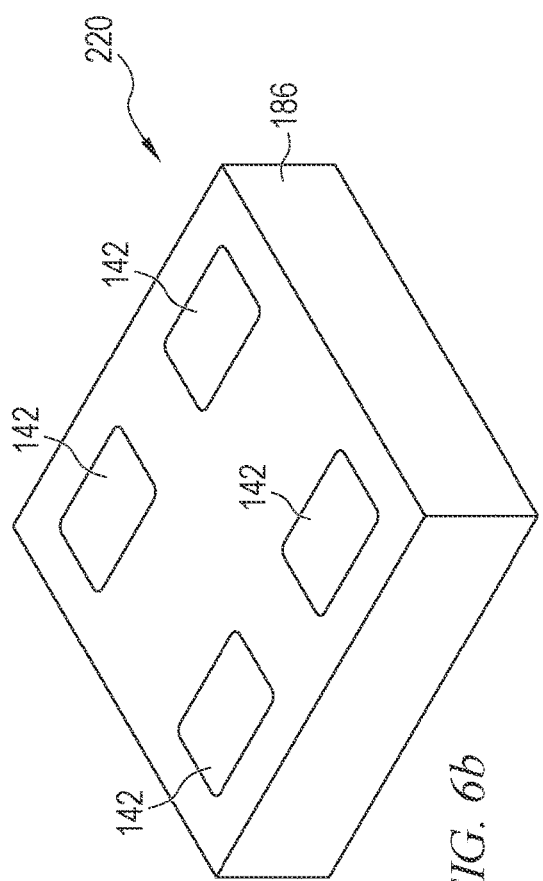
FIG. 6a
FIG. 6b

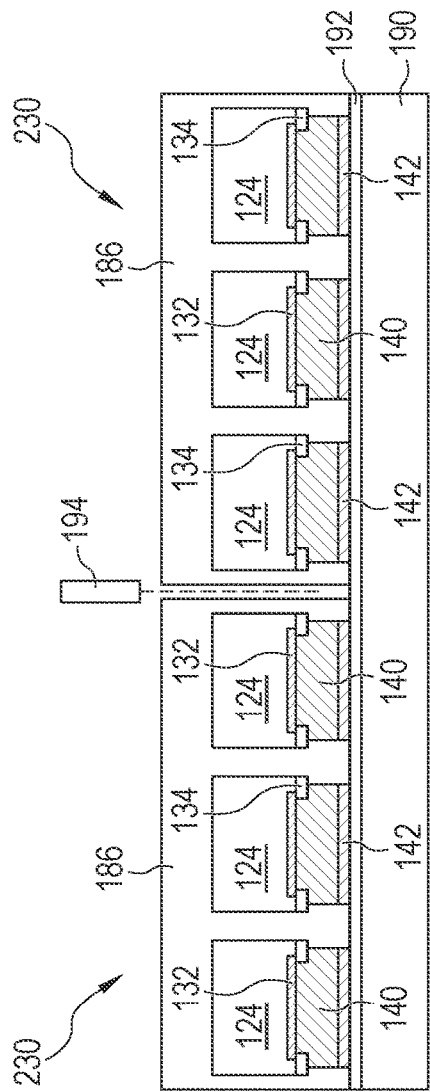
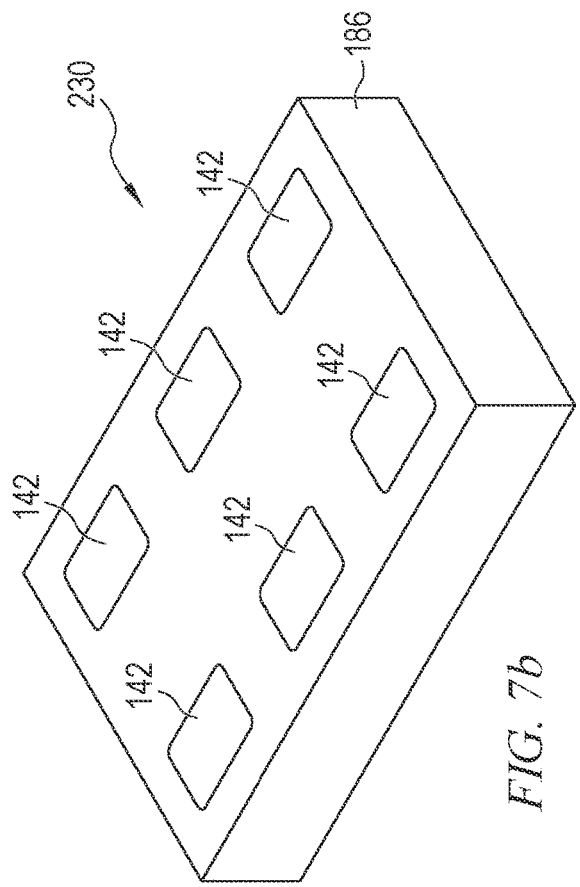
FIG. 7a
FIG. 7b

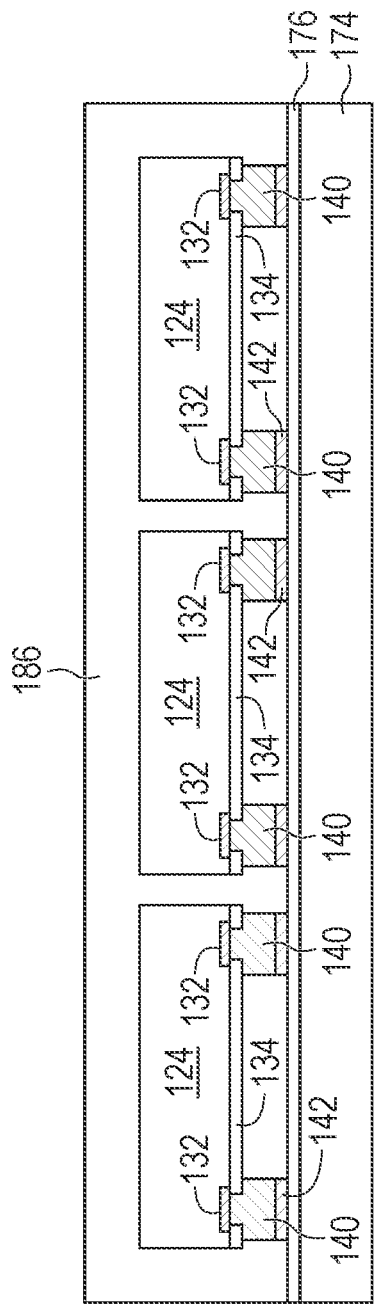
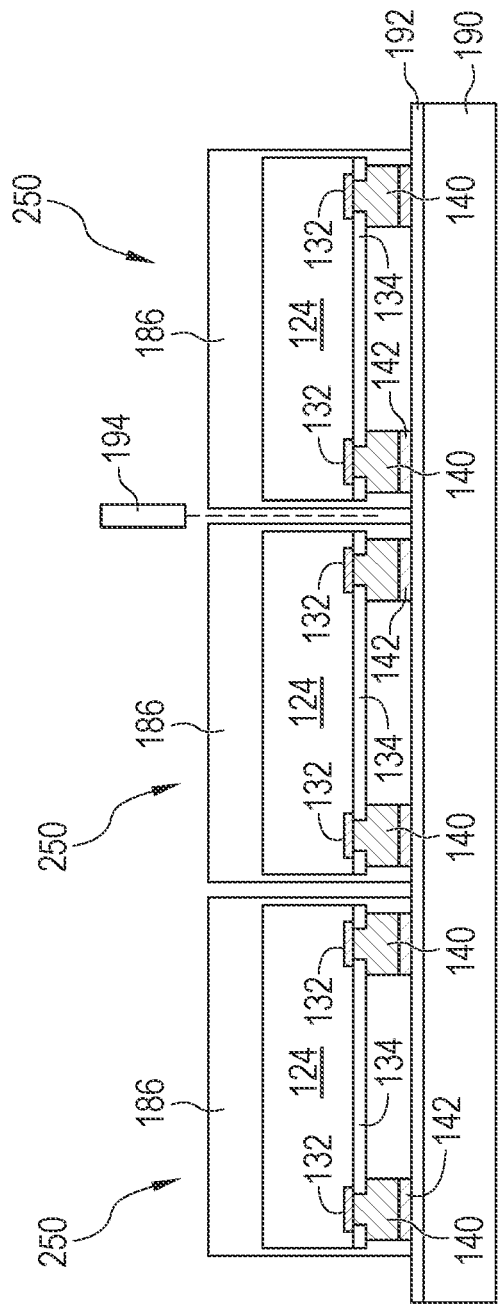

SINGLE-SHOT ENCAPSULATION

CLAIM TO DOMESTIC PRIORITY

The present application is a continuation of U.S. patent application Ser. No. 16/525,193, now U.S. Pat. No. 11,171,099, filed Jul. 29, 2019, which is a division of U.S. patent application Ser. No. 15/668,969, now U.S. Pat. No. 10,410,988, filed Aug. 4, 2017, which claims the benefit of U.S. Provisional Application No. 62/372,720, filed Aug. 9, 2016, which applications are incorporated herein by reference.

FIELD OF THE INVENTION

The present invention relates in general to semiconductor devices and, more particularly, to a semiconductor device and method of encapsulating a semiconductor die using single-shot encapsulation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

One goal of semiconductor manufacturing is to produce smaller semiconductor devices. Smaller devices, and the resulting smaller end products, typically consume less power, can be produced more efficiently, and have higher performance. Smaller semiconductor devices and smaller end products consume less materials in manufacturing which reduces environmental impact. In addition, smaller semiconductor devices have a smaller footprint, which is desirable for crowded printed circuit boards and smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor manufacturing can also be made more efficient by reducing manufacturing steps. Manufacturers seek to streamline the processes for making semiconductor devices, such that fewer steps are required, fewer materials are used, and more environmental friendly materials are used. Improving manufacturing processes can improve time to market for new products as well as cost to manufacture.

A need exists to provide a semiconductor package with improved cost, time to manufacture, environmental impact, and parasitic characteristics.

BRIEF DESCRIPTION OF THE DRAWINGS

FIGS. 1a-1e illustrate forming low-profile bumps on a semiconductor wafer;

FIGS. 2a-2c illustrate low-profile bumps over a passivation layer opening;

FIGS. 4a-4f illustrate packaging semiconductor die from a wafer with single-shot encapsulation;

FIGS. 6a-6b illustrate a dual gang package made with single-shot encapsulation;

FIGS. 7a-7b illustrate a triple gang package made with single-shot encapsulation;

FIGS. 8a-8d illustrate a second process flow for packaging a semiconductor die with single-shot encapsulation;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. The finished package is then inserted into an electrical system and the functionality of the semiconductor device is made available to the other system components.

Figure 1A:
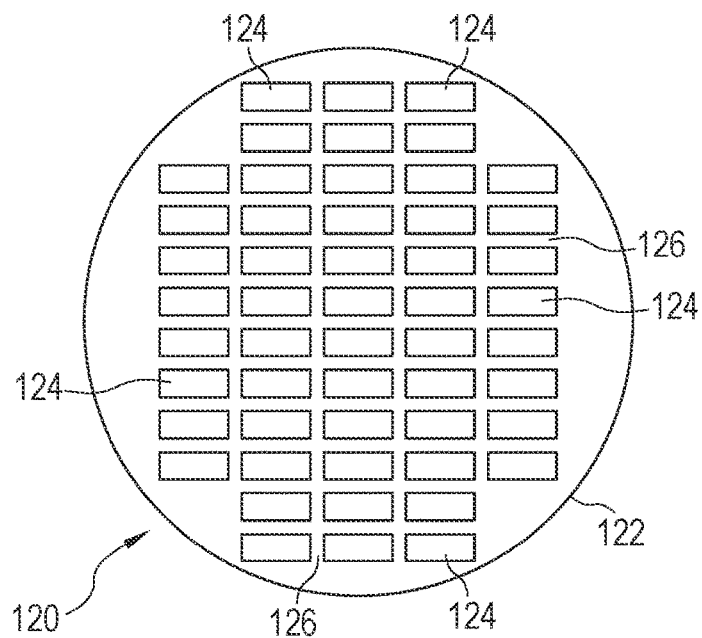

FIG. 1a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126. Saw street 126 provides cutting areas to singulate semiconductor wafer 120 into individual semiconductor die 124. In one embodiment, semiconductor wafer 120 has a width or diameter of 100-450 millimeters (mm).

Figure 1B:
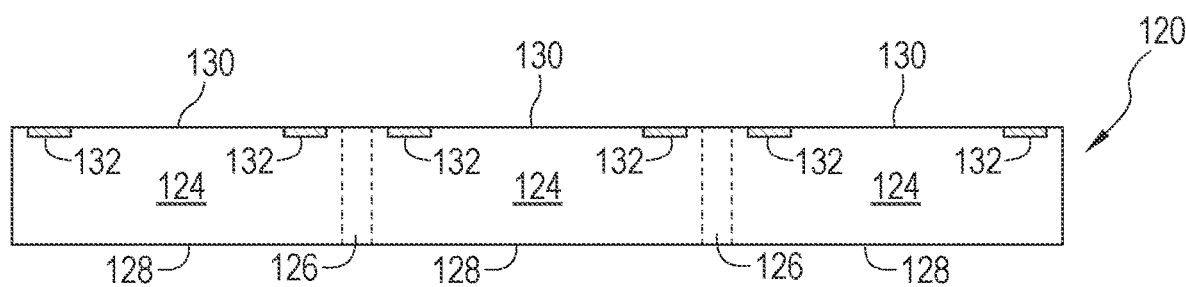

FIG. 1b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. Semiconductor die 124 may also contain integrated passive devices (IPDs), such as inductors, capacitors, and resistors, for RF signal processing. In one embodiment, semiconductor die 124 includes a single active component, e.g., a diode or a power MOSFET.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130.

In FIG. 1c, an insulating or dielectric layer 134 is formed over semiconductor wafer 120. Insulating layer 134 contains one or more layers of silicon dioxide (SiO2), silicon nitride (Si3N4), silicon oxynitride (SiON), tantalum pentoxide (Ta2O5), aluminum oxide (Al2O3), solder resist, other material having similar insulating and structural properties. A portion of insulating layer 134 is removed by laser direct ablation (LDA), etching, or other suitable process to expose conductive layer 132 on semiconductor die 124.

In FIG. 1d, low-profile pillar bumps 140 are grown upward from conductive layer 132 using an electroplating process. Low-profile pillar bumps 140 are directly fabricated from the die pads upward. In some embodiments, pillar bumps 140 are formed from Al, Cu, Sn, Ni, Au, Ag, titanium (Ti), tungsten (W), another suitable electrically conductive material, or alloys thereof using electrolytic plating, electroless plating, or other suitable deposition process. In other embodiments, pillar bumps 140 are formed using a photolithography mask. In one embodiment, low-profile pillar bumps 140 are approximately 0.5 mm by 0.5 mm in plan view with a height of approximately 50 micron (μm). A solder cap 142 is deposited over bumps 140 in FIG. 1e.

Solder cap 142 is formed by electroplating or otherwise depositing Ni, Au, Sn, Ag, or combinations thereof over bumps 140. In one embodiment, pillar bumps 140 and solder cap 142 are formed using a single masking layer. In some embodiments, solder cap 142 includes a lead-free solder.

FIGS. 2a-2c illustrate forming low-profile bumps 140 over openings in a polyimide (PI) passivation layer. In FIG. 2a, PI layer 150 is formed over insulating layer 134. Other passivation materials are used in other embodiments. PI layer 150 protects insulating layer 134 during subsequent manufacturing steps. In FIG. 2b, openings 152 are formed through PI layer 150 by LDA or other suitable etching process to expose conductive layer 132 for the formation of bumps 140 and solder caps 142 in FIG. 2c.

Figure 3:
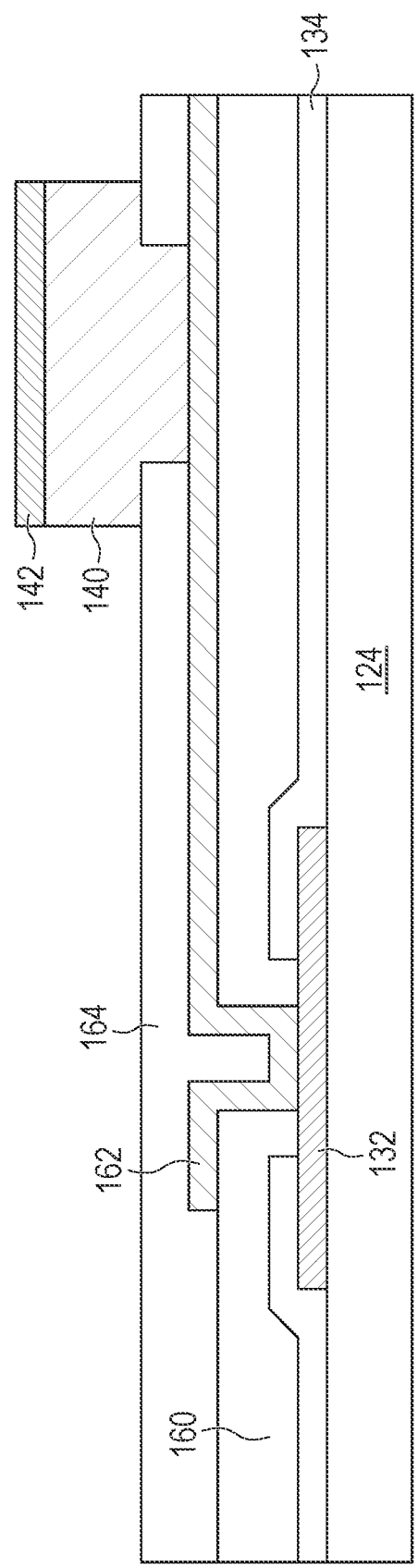
FIG. 3 illustrates a low-profile bump and redistribution-layer.

FIG. 3 illustrates a redistribution layer (RDL) formed over semiconductor die 124 prior to the formation of bumps 140. An insulating or dielectric layer 160 is formed over insulating layer 134 and conductive layer 132. Insulating layer 160 contains one or more layers of SiO2, Si3N4, SiON, Ta2O5, Al2O3, or other material having similar insulating and structural properties. Insulating layer 160 extends completely across semiconductor wafer 120. A portion of insulating layer 160 is removed by LDA, etching, or other suitable process to expose conductive layer 132 for subsequent electrical interconnect.

An electrically conductive layer 162 is formed over insulating layer 160 using PVD, CVD, electrolytic plating, electroless plating, or other suitable metal deposition process. Conductive layer 162 contains one or more layers of Al, Cu, Sn, Ni, Au, Ag, or other suitable electrically conductive material. In one embodiment, conductive layer 162 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 162 is electrically connected to conductive layer 132 of semiconductor die 124 through the openings in insulating layer 160. Conductive layer 162 is patterned in a fan-out or fan-in configuration to position low-profile bumps 140 over semiconductor die 124 as desired. In some embodiments, additional insulating and conductive layers are interleaved over insulating layer 160 and conductive layer 162 to implement more advanced signal routing.

An insulating or passivation layer 164, similar to insulating layer 160 or PI layer 150, is formed over insulating layer 160 and conductive layer 162. Openings are formed in passivation layer 164 over conductive layer 162. Low-profile bumps 140 and solder caps 142 are formed on conductive layer 162 through openings in passivation layer 164 as in FIGS. 1d and 1e.

Figure 4C:
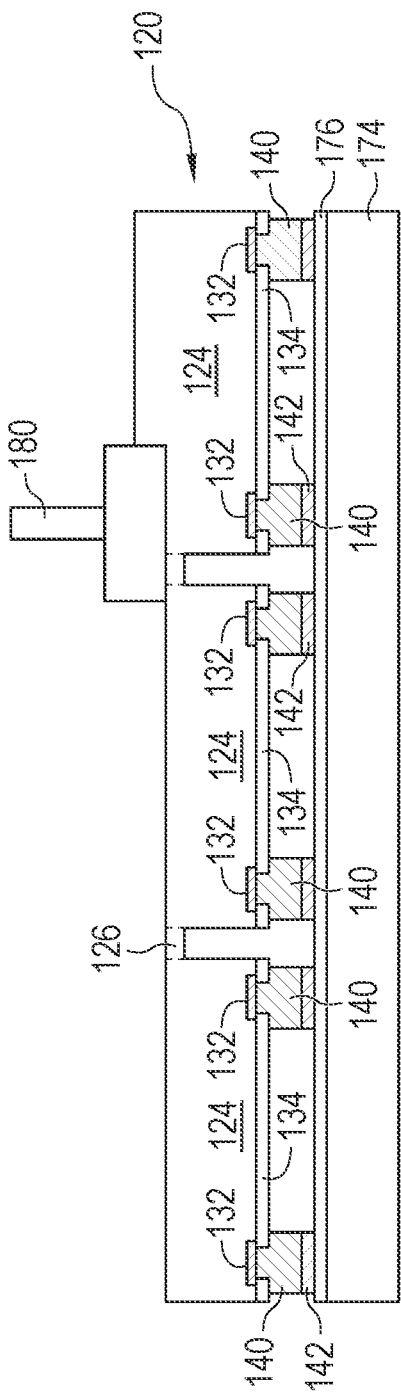

FIGS. 4a-4f illustrate packaging individual semiconductor die 124 from FIGS. 1a-1e using a single-shot encapsulation process. A similar process is performed on semiconductor wafer 120 in FIG. 2c or FIG. 3 if a PI layer or RDL is desired. In FIG. 4a, wafer 120 is trenched between semiconductor die 124. Trenches 170 are formed through insulating layer 134 and only partially through wafer 120 in saw streets 126 using laser cutting tool or saw blade 172. In one embodiment, trenches 170 are formed using deep reactive-ion etching (DRIE). In some embodiments, trenches 170 are formed to a depth of between 60 and 200 μm, inclusive of the height of bumps 140 and solder cap 142.

In FIG. 4b, wafer 120 is flipped and mounted onto base support 174 and backgrinding tape 176 with active surface 130 and trenches 170 oriented toward the base support. Wafer 120 is backgrinded with a mechanical grinding or etching process using backgrinding tool 180 to remove a portion of base material 122 and reduce the thickness of semiconductor wafer 120. Thinning semiconductor wafer 120 with backgrinding tool 180 forms a new back surface 178 of the semiconductor wafer. In the embodiment shown in FIG. 4b, trenches 170 were formed at least as deep as a desired final thickness for semiconductor die 124. The backgrinding operation separates semiconductor die 124 from each other by removing all remaining semiconductor material in saw streets 126.

Figure 4D:
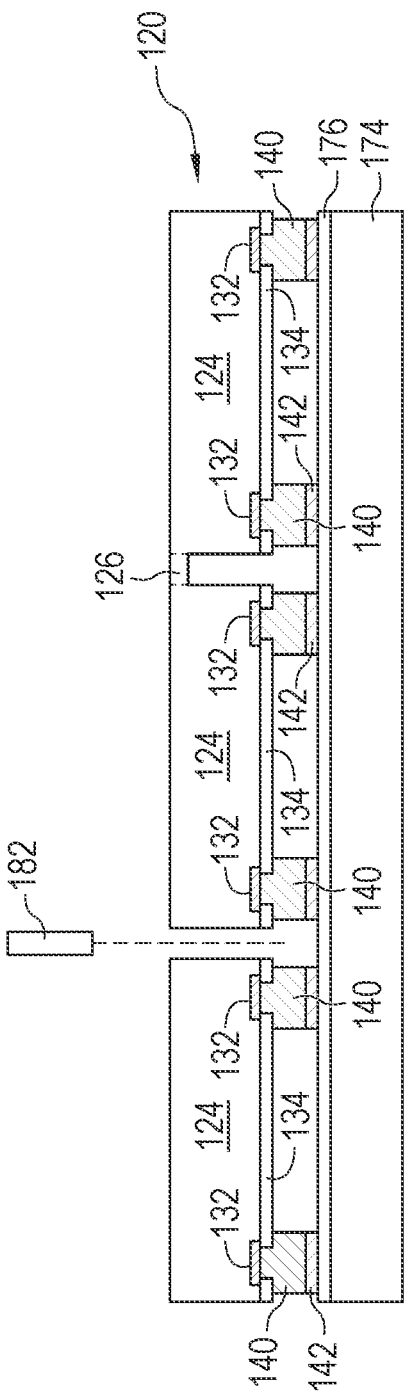

FIGS. 4c-4d illustrate an alternative embodiment where trenches 170 were not formed completely through the desired final thickness of semiconductor die 124. Backgrinding tool 180 removes a portion of semiconductor wafer 120, but does not thin the semiconductor wafer sufficiently to separate semiconductor die 124. In some embodiments, the thickness of semiconductor die 124 after backgrinding, inclusive of bumps 140-142, is in the range of between 80 and 220 μm, with around 20 μm of semiconductor wafer thickness remaining in saw streets 126 after backgrinding is completed. Semiconductor die 124 are singulated in FIG. 4d by removing remaining portions of semiconductor wafer 120 within saw streets 126 using laser cutting tool or saw blade 182. DRIE or another suitable etching process is used to singulate semiconductor die 124 after backgrinding in some embodiments.

Figure 4E:
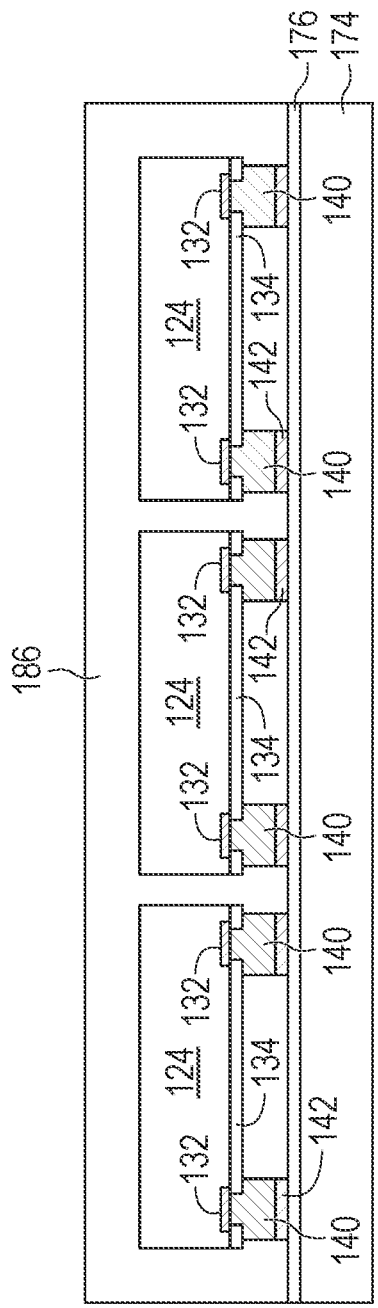

Semiconductor die 124 in either of the alternative embodiments of FIG. 4b or FIG. 4d is optionally exposed to an oxide coating after singulation, e.g., by sputtering. In FIG. 4e, an encapsulant or molding compound 186 is deposited over semiconductor die 124 and low-profile bumps 140 as an insulating material using a paste printing, compressive molding, transfer molding, liquid encapsulant molding, vacuum lamination, spin coating, or other suitable applicator. In particular, encapsulant 186 covers the side surfaces, active surface 130, and back surface 178 of semiconductor die 124. Encapsulant 186 also extends completely around each bump 140 while leaving solder caps 142 exposed from the encapsulant. Encapsulant 186 can be polymer composite material, such as epoxy resin with filler, epoxy acrylate with filler, or polymer with proper filler. Encapsulant 186 is non-conductive and environmentally protects the semiconductor device from external elements and contaminants. Encapsulant 186 also protects semiconductor die 124 from degradation due to exposure to light.

In some embodiments, a surface of encapsulant 186 is coplanar with a surface of solder caps 142. In other embodiments, solder caps 142 are recessed within encapsulant 186 or extend from the encapsulant. Semiconductor die 124 and encapsulant 186 are removed from carrier 174 as a panel and put through an optional post mold curing (PMC) process, e.g., in an oven. Encapsulant 186 maintains the relative position of each semiconductor die 124 approximately as though the semiconductor die remained as part of semiconductor wafer 120. Semiconductor die 124 are connected to each other by encapsulant 186 rather than base material 122.

After PMC, semiconductor die 124 within encapsulant 186 are mounted onto carrier 190 with thermal or UV release tape 192 for singulation. Semiconductor die 124 are singulated between the semiconductor die using saw blade, laser cutting tool, or water cutting tool 194 into single-shot encapsulation (SSE) packages 200. The singulated SSE packages 200 are released from carrier 190 thermally, or through UV irradiation, and packed into, e.g., a tape and reel for delivery to customers who will integrate the packages into electronic devices. SSE packages 200 are sent to a test operation in some embodiments.

Figure 4F:
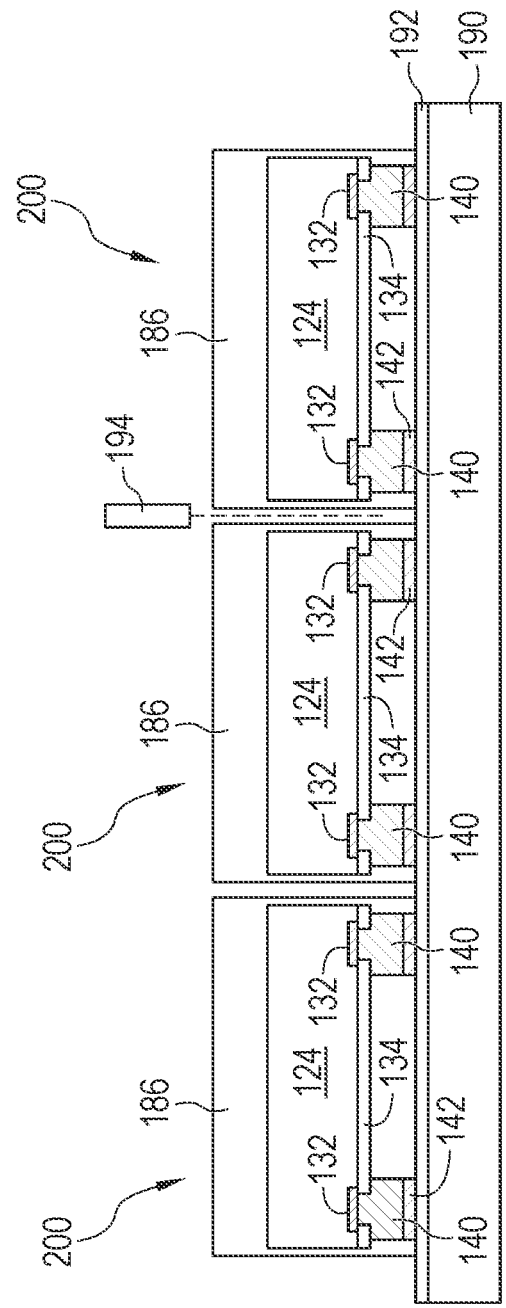
Figure 5B:
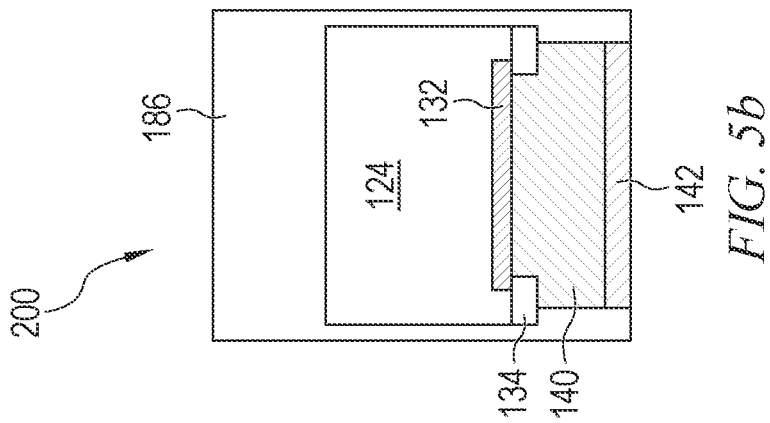
FIGS. 5a-5d illustrate a semiconductor package made with single-shot encapsulation.
Figure 5A:
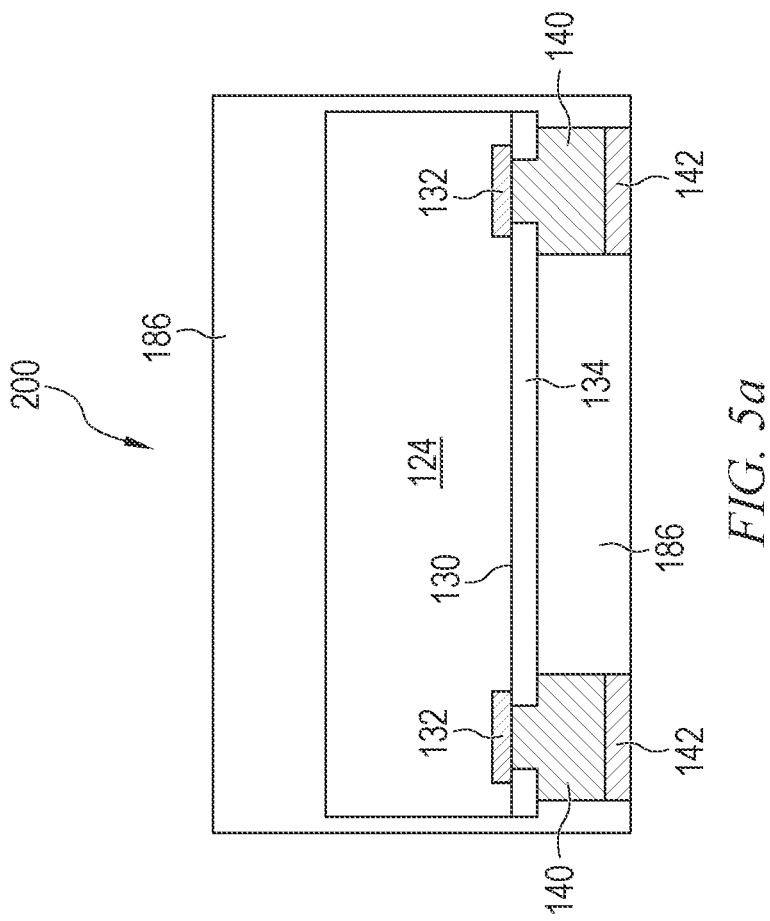

FIGS. 5a-5d illustrate an SSE package 200 from a variety of views. FIG. 5a shows a cross-section of SSE package 200 in the view of FIGS. 4a-4f. FIG. 5b illustrates a cross-sectional view with SSE package 200 turned ninety degrees to the left or right relative to FIG. 5a. While semiconductor die 124 in FIGS. 5a-5d is a two-terminal device, e.g., a diode, more complex semiconductor die 124 with additional terminals and additional bumps 140 are packaged similarly in other embodiments. Semiconductor die 124 can be a two-terminal device, a three terminal device, e.g., a power MOSFET, or have many more terminals, e.g., an ASIC with address and data busses.

Figure 5C:
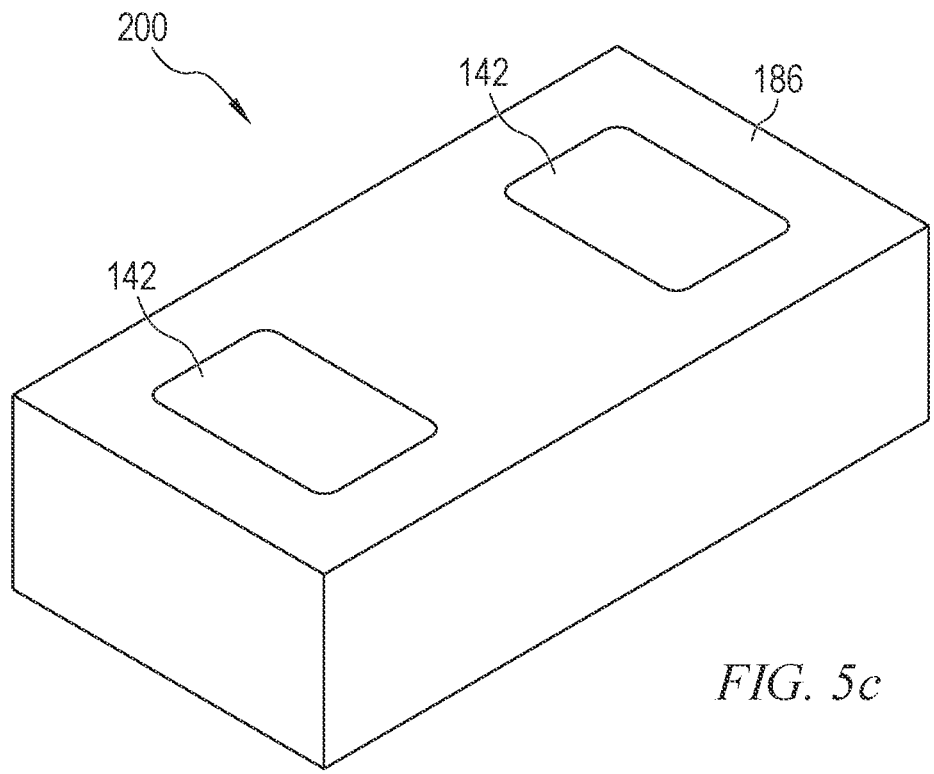
Figure 5D:
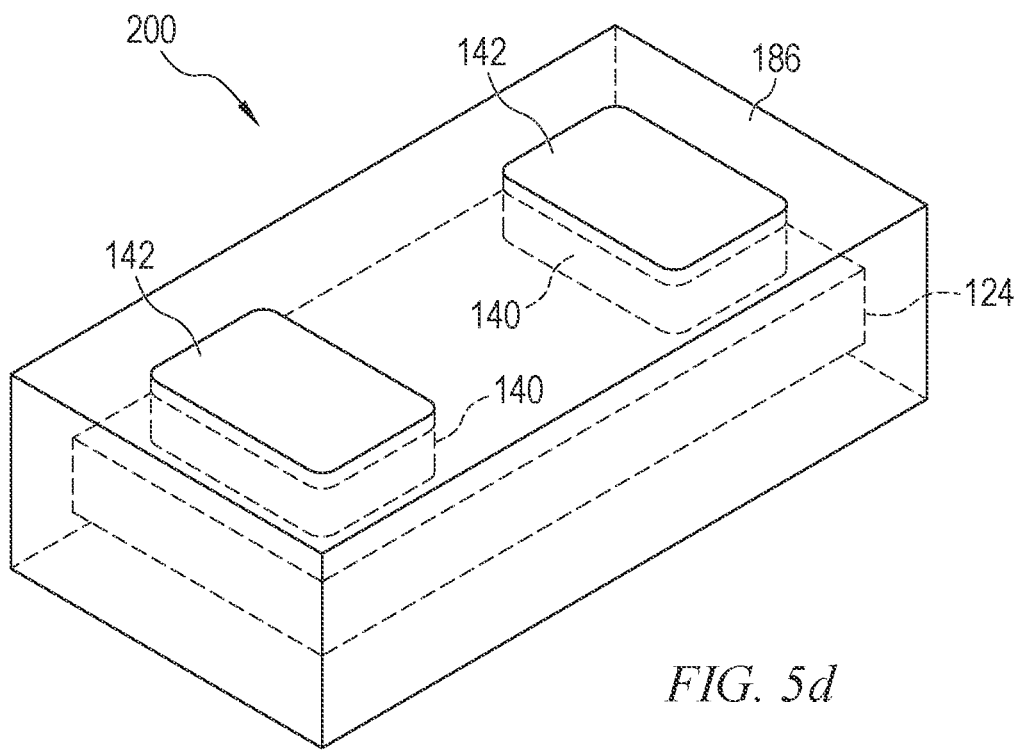

FIGS. 5c and 5d illustrate a perspective view of SSE package 200. FIG. 5c is an external view while FIG. 5d illustrates encapsulant 186 as transparent to reveal the structure of semiconductor die 124 and bumps 140 within the encapsulant. Dotted lines in FIG. 5d are lines that are only visible due to encapsulant 186 being transparent.

SSE packages 200 are formed with no requirement of a base leadframe or substrate that remains as part of the final package, which allows a reduced package thickness. In some embodiments, a thickness of SEE packages 200 is approximately 0.150 mm or lower. The relatively low thickness of SSE packages 200 meets the needs of manufacturers of ever-smaller devices, especially wearable and internet-of-things (IoT) devices. The construction of SSE packages 200, allowing the elimination of internal substrates and wire bonds improves package reliability, increases product performance, and simplifies the assembly process. Parasitic electrical characteristics, e.g., resistance, inductance, and capacitance, are reduced as well.

The construction of SSE packages 200, without internal solder bonds, allows for the use of lead-free solder for solder caps 142 that melts at a higher temperature relative to traditional tin-lead solders. In other package types, internal solder bonds, e.g., to couple semiconductor die 124 to a leadframe using a ball-grid array or wirebond connection, may melt while mounting the final package to a printed circuit board (PCB) or other substrate. SSE package 200 can be mounted to a substrate at the higher temperatures required with lead-free solder without risking package integrity. Pillar bumps 140 with solder cap 142 can be formed at the wafer level and not reflowed until SSE package 200 is attached on the customer's PCB using the solder caps. SSE package 200 is thin and lightweight, with an improved second level board reliability and time to market due to the simplified process flow.

FIGS. 6a-6b illustrate forming a dual gang package 220 including two semiconductor die 124 in the same package. Cutting tool 194 is used to singulate semiconductor die 124, as in FIG. 4f. However, adjacent semiconductor die 124 are not singulated for some of the semiconductor die pairs. Dual gang package 220 includes two semiconductor die 124 that can be connected to a pair of conductive traces on a PCB. FIGS. 7a-7b illustrate singulating semiconductor die 124 into groups of three semiconductor die to form triple gang packages 230. Semiconductor die 124 can be singulated into any desired configuration for the number of devices to be used together on a circuit board.

Figure 8A:
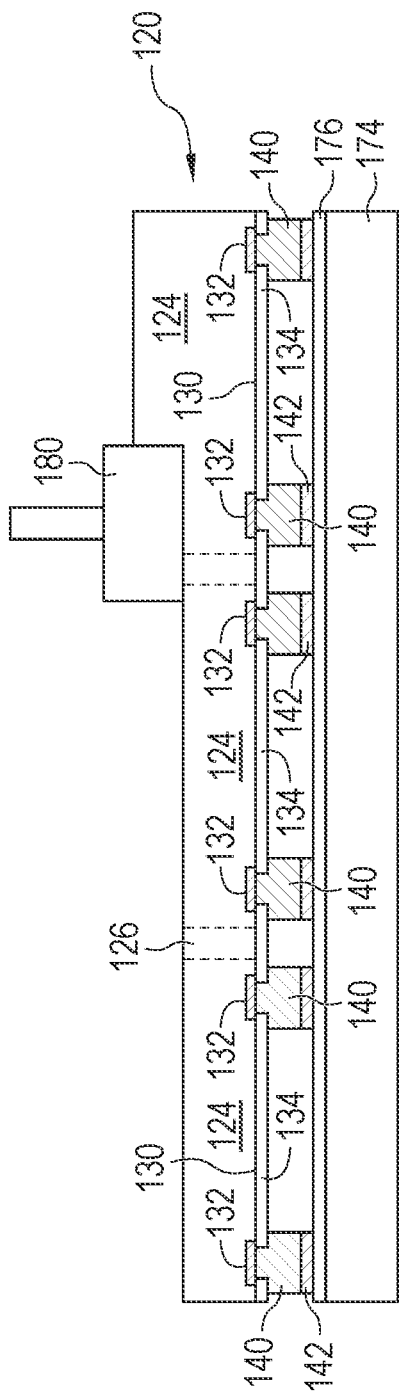
Figure 8B:
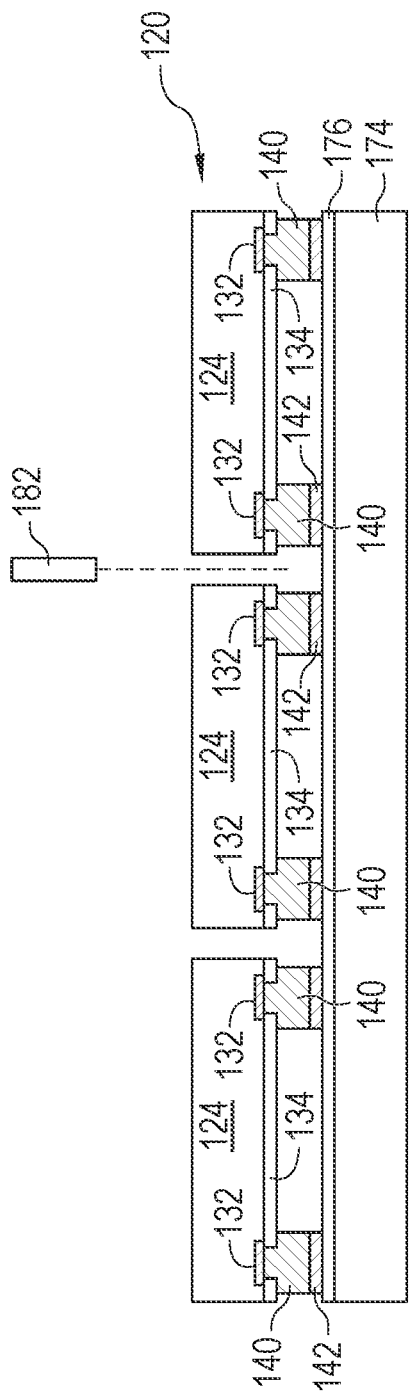

FIGS. 8a-8d illustrate a single-shot encapsulation process that is alternative to the flow in FIGS. 4a-4f. In FIG. 8a, semiconductor wafer 120 is disposed with active surface 130 oriented toward carrier 174, as in FIG. 4c, but without prior formation of trenches 170. Semiconductor wafer 120 from FIG. 2c or 3 could also be used if a PI layer and/or RDL layer are desired. In FIG. 8b, as in FIG. 4d, semiconductor die 124 are singulated using saw blade or laser cutting tool 182. DRIE is used in some embodiments. Encapsulant 186 is deposited in FIG. 8c as in FIG. 4e, and the encapsulated semiconductor die 124 are singulated into SSE packages 250 in FIG. 8d as in FIG. 4f. SSE packages 250 are similar to SSE packages 200, but the process proceeds without formation of trenches 170.

Figure 9A:
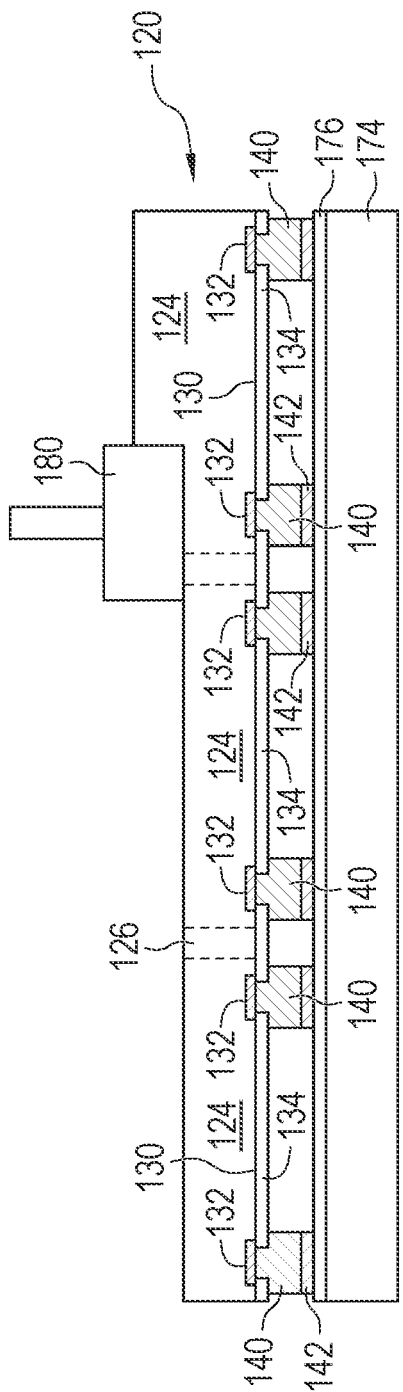
FIGS. 9a-9f illustrate a third process flow for packaging a semiconductor die with single-shot encapsulation.
Figure 9B:
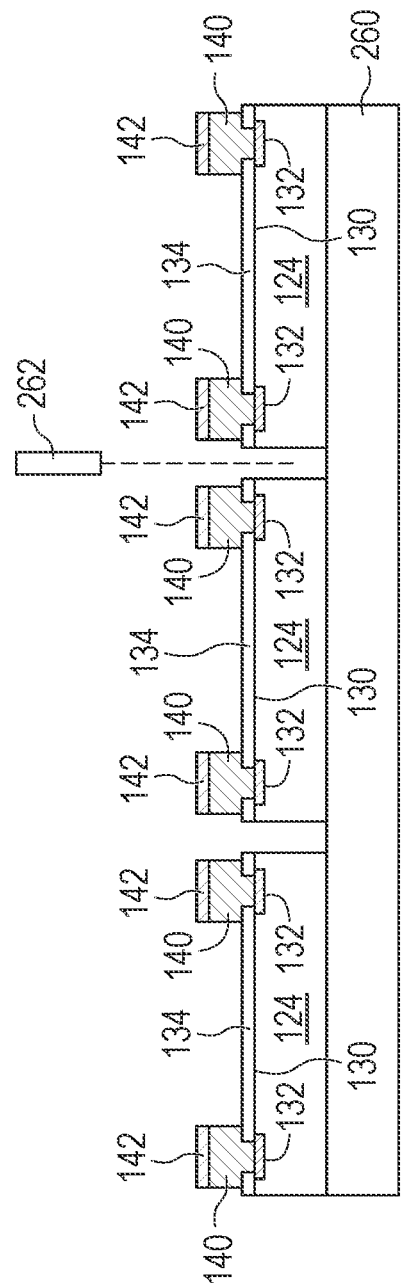
Figure 9C:
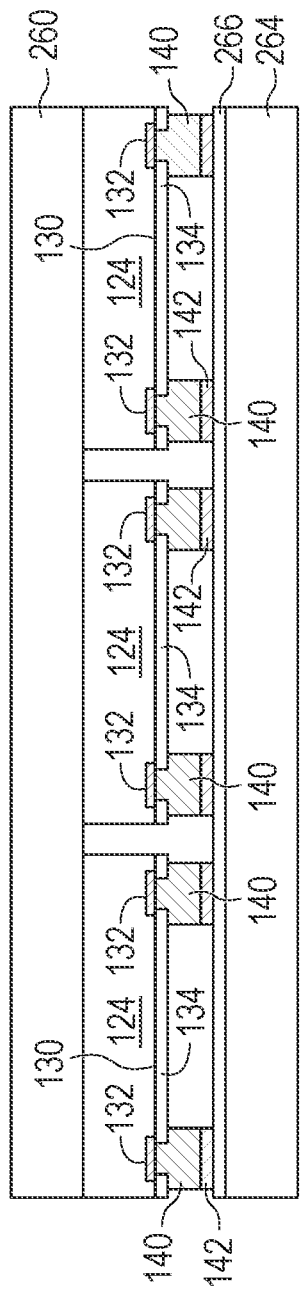
Figure 9D:
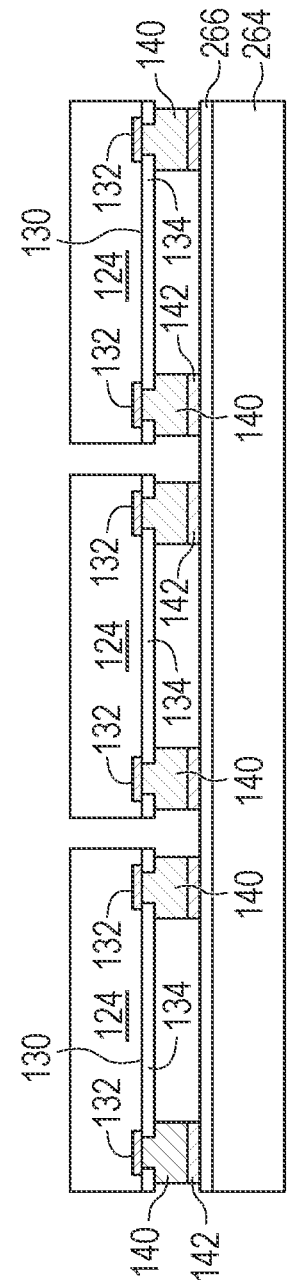

FIGS. 9a-9f illustrate a third process flow for single-shot encapsulation. In FIG. 9a, semiconductor wafer 120 is backgrinded as in FIG. 8a. In FIG. 9b, semiconductor wafer 120 is mounted on thermal release tape 260 with back surface 178 oriented toward the thermal release tape. Saw blade or laser cutting tool 262 is used to singulate semiconductor die 124 through saw streets 126. After singulation, semiconductor die 124 are transfer-mounted onto support base or carrier 264 as shown in FIG. 9c. UV or thermal transfer tape 266 is disposed on carrier 264 prior to mounting of semiconductor die 124. In one embodiment, tape 260 is a thermal tape and tape 266 is a UV tape. In FIG. 9d, an elevated temperature is used to remove thermal release tape 260 without releasing UV tape 266. In another embodiment, tape 266 is a thermal release tape while tape 260 is a UV release tape.

Figure 9E:
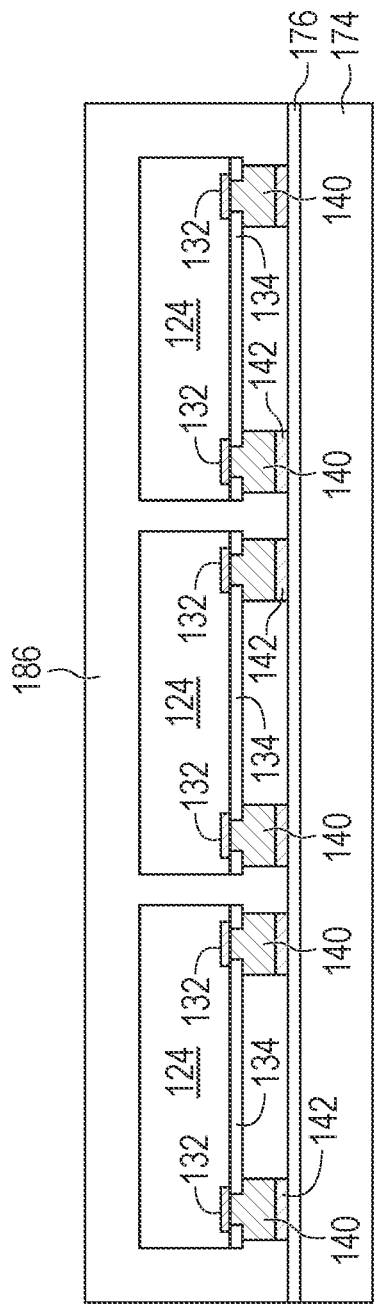
Figure 9F:
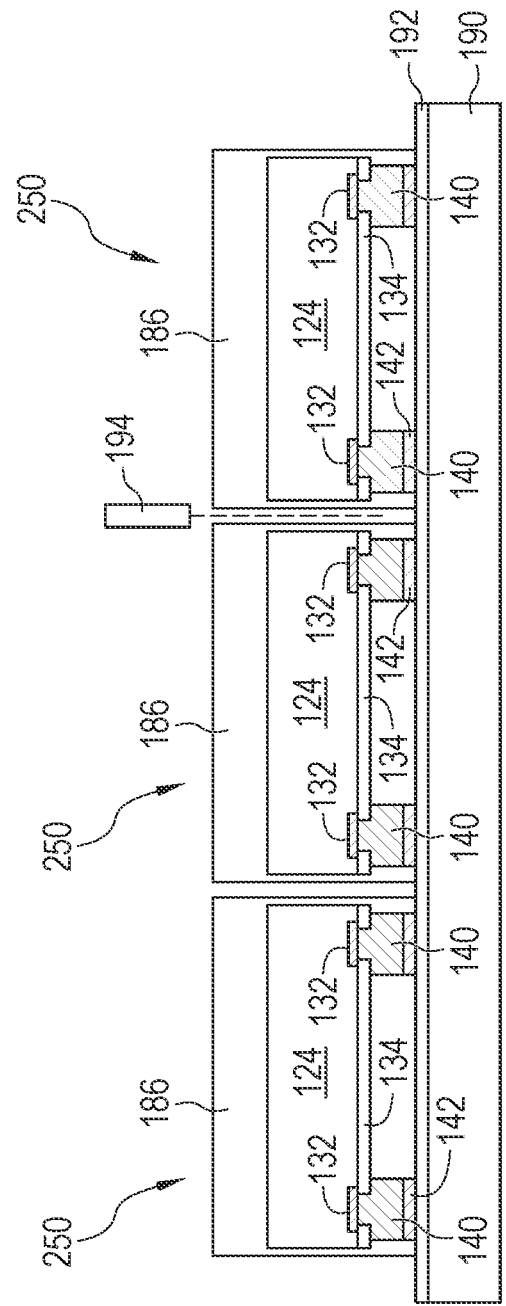

Encapsulant 186 is deposited in FIG. 9e as in FIG. 4e, and the encapsulated semiconductor die 124 are singulated into SSE packages 270 in FIG. 9f as in FIG. 4f. SSE packages 270 are similar to SSE packages 200, but the process proceeds as in FIGS. 9a-9f.

Figure 10A:
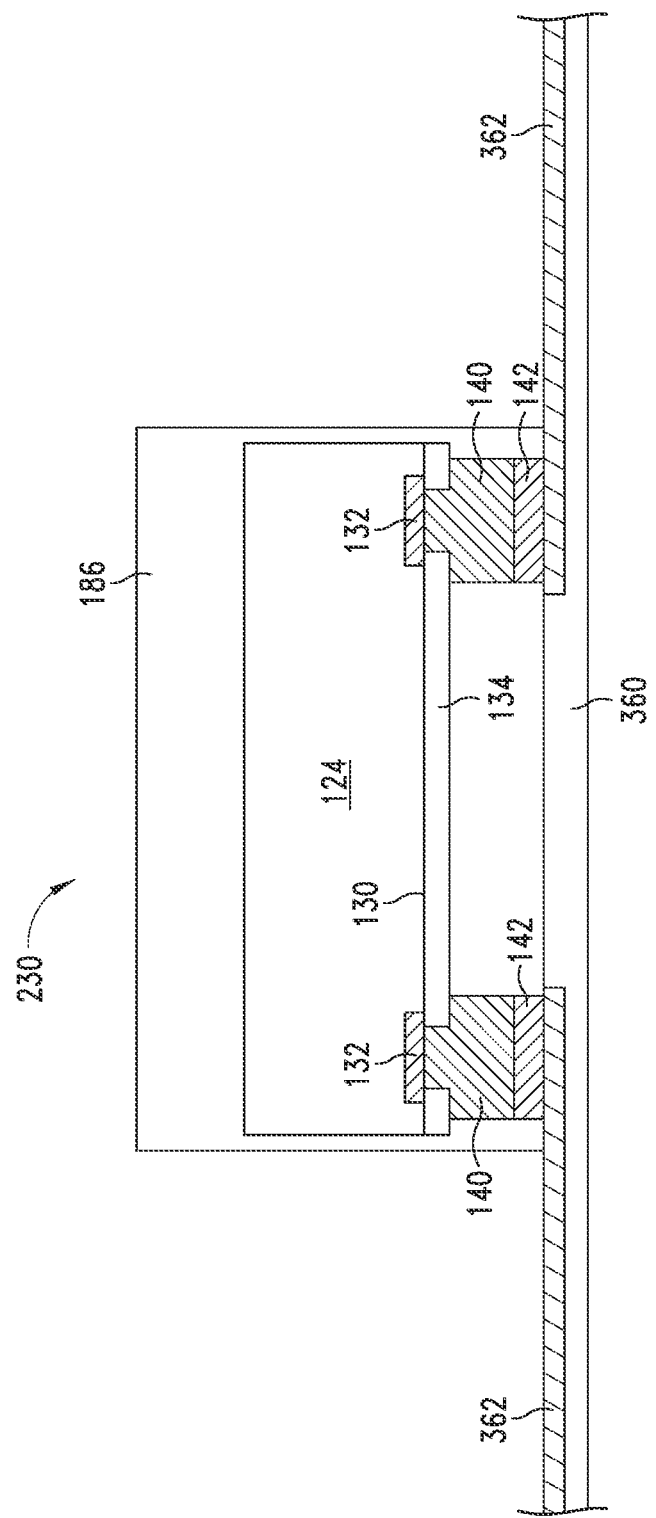
FIGS. 10a-10b illustrate an electronic device utilizing the semiconductor package.

FIG. 10a illustrates one of the SSE packages mounted onto a PCB or other substrate 360. Substrate 360 includes a conductive layer or traces 362 formed over a surface of the substrate. Conductive layer 362 is patterned as desired to implement the intended functionality of an electronic device. FIG. 10a shows SSE package 230 as an example, but any of the disclosed SSE packages are mounted similarly. SSE package 230 is disposed on substrate 360 with encapsulant 186 contacting the substrate. Solder caps 142 contact conductive layer 362. In some embodiments, an offset exists between SSE package 230 and substrate 360, for instance due to an adhesive layer used for attachment, additional solder paste provided on conductive layer 362, or other logistical realities of device manufacturing. Solder caps 142 are reflowed onto conductive layer 362 to mechanically bond and electrically connect SSE package 230 to substrate 360. Solder 142 is substantially contained within the opening of encapsulant 186.

Figure 10B:
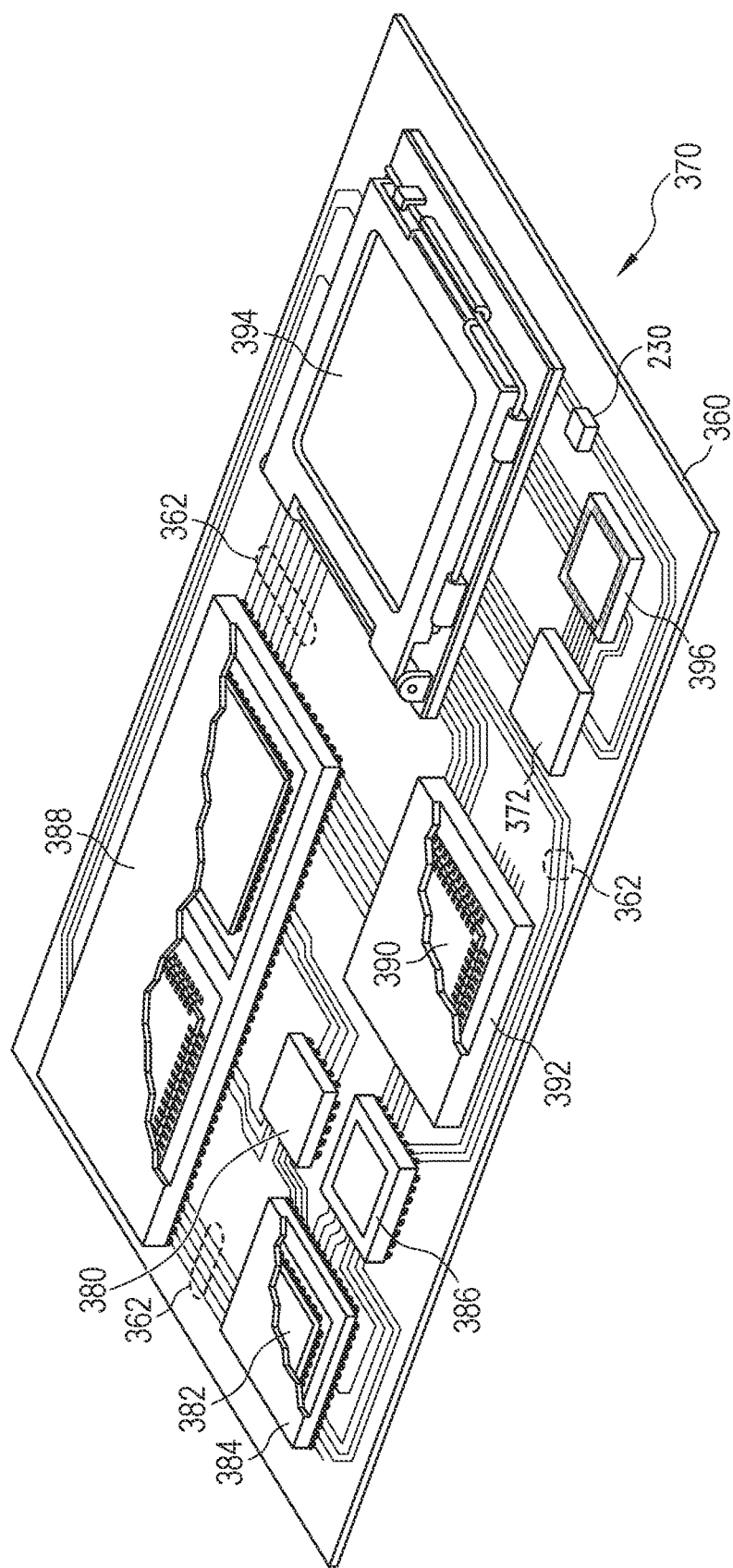

FIG. 10b illustrates SSE package 230 mounted on PCB 360 as part of an electronic device 370 with a plurality of semiconductor packages mounted on a surface of the PCB along with the SSE package. Electronic device 370 can have one type of semiconductor package, or multiple types of semiconductor packages, depending on the application.

Electronic device 370 can be a stand-alone system that uses the semiconductor packages to perform one or more electrical functions. Alternatively, electronic device 370 can be a subcomponent of a larger system. For example, electronic device 370 can be part of a tablet, cellular phone, digital camera, communication system, or other electronic device. Electronic device 370 can also be a graphics card, network interface card, or other signal-processing card that can be inserted into a computer. The semiconductor packages can include microprocessors, memories, ASIC, logic circuits, analog circuits, RF circuits, discrete devices, or other semiconductor die or electrical components.

In FIG. 10b, PCB 360 provides a general substrate for structural support and electrical interconnect of the semiconductor packages mounted on the PCB. Conductive signal traces 362 are formed over a surface or within layers of PCB 360 using evaporation, electrolytic plating, electroless plating, screen printing, or other suitable metal deposition process. Signal traces 362 provide for electrical communication between each of the semiconductor packages, mounted components, and other external system components. Traces 362 also provide power and ground connections to the semiconductor packages as needed.

SSE package 372 is an ASIC packaged using one of the single-shot encapsulation processes disclosed above. SSE package 230 is the triple gang package, and soldered in series with three adjacent conductive traces. For the purpose of illustration, several types of first level packaging, including bond wire package 390 and flipchip 382, are shown on PCB 360. Additionally, several types of second level packaging, including ball grid array (BGA) 384, bump chip carrier (BCC) 392, land grid array (LGA) 394, multi-chip module (MCM) 388, quad flat non-leaded package (QFN) 396, embedded wafer level ball grid array (eWLB) 386, and wafer level chip scale package (WLCSP) 380 are shown mounted on PCB 360. In one embodiment, eWLB 386 is a fan-out wafer level package (Fo-WLP) or fan-in wafer level package (Fi-WLP). Depending upon the system requirements, any combination of semiconductor packages, configured with any combination of first and second level packaging styles, as well as other electronic components, can be connected to PCB 360.

In some embodiments, electronic device 370 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer;
    forming a plurality of pillar bumps over the wafer;
    singulating the semiconductor wafer into a plurality of semiconductor die; and
    depositing an encapsulant over the semiconductor die with the pillar bumps exposed from the encapsulant.

2. The method of claim 1, wherein the pillar bumps include solder caps.

3. The method of claim 2, wherein the solder caps include lead-free solder.

4. The method of claim 1, further including transfer-mounting the semiconductor die prior to depositing the encapsulant.

5. The method of claim 1, further including singulating the semiconductor die through the encapsulant.

6. The method of claim 5, further including singulating the semiconductor die with a plurality of semiconductor die packaged together.

7. A method of making a semiconductor device, comprising:
providing a semiconductor die;
forming a pillar bump over the semiconductor die;
forming a solder cap over the pillar bump; and
depositing an encapsulant over the semiconductor die, pillar bump, and solder cap.

8. The method of claim 7, wherein a surface of the encapsulant is coplanar with a surface of the solder cap.

9. The method of claim 7, further including disposing the semiconductor die over a substrate after depositing the encapsulant, wherein the encapsulant contacts the substrate.

10. The method of claim 9, further including reflowing the solder cap onto a contact pad of the substrate.

11. The method of claim 7, further including forming a redistribution layer over the semiconductor die prior to forming the pillar bump.

12. The method of claim 7, further including:
depositing the encapsulant over a plurality of semiconductor die; and
singulating through the encapsulant, wherein the plurality of semiconductor die remains mechanically connected to each other by the encapsulant after singulating.

13. The method of claim 12, further including disposing the plurality of semiconductor die over a substrate, wherein the plurality of semiconductor die are mechanically connected to the substrate by the solder cap and remain mechanically connected to each other by the encapsulant.

14. A semiconductor device, comprising:
a semiconductor die;
a pillar bump formed over the semiconductor die;
a solder cap formed over the pillar bump; and
an encapsulant deposited over the semiconductor die, pillar bump, and solder cap, wherein a surface of the solder cap is coplanar with a surface of the encapsulant.

15. The semiconductor device of claim 14, further including a second semiconductor die disposed in the encapsulant, wherein the encapsulant extends continuously from the first semiconductor die to the second semiconductor die.

16. The semiconductor device of claim 15, further including a printed circuit board, wherein the solder cap is bonded to a conductive trace or contact pad of the printed circuit board.

17. The semiconductor device of claim 14, wherein the solder cap includes lead-free solder.

18. The semiconductor device of claim 14, further including a first insulating layer formed over the first semiconductor die, wherein the pillar bump extends through an opening of the first insulating layer to contact the first semiconductor die.

19. The semiconductor device of claim 18, wherein a footprint of the opening is smaller than a footprint of the pillar bump.

20. A semiconductor device, comprising:
a semiconductor die;
a pillar bump formed over the semiconductor die;
a solder cap formed over the pillar bump; and
an encapsulant deposited over the semiconductor die, pillar bump, and solder cap.

21. The semiconductor device of claim 20, wherein a surface of the encapsulant is coplanar with a surface of the solder cap.

22. The semiconductor device of claim 20, further including a substrate, wherein the encapsulant contacts the substrate.

23. The semiconductor device of claim 20, further including a redistribution layer formed between the semiconductor die and pillar bump.

24. The semiconductor device of claim 20, further including a plurality of semiconductor die mechanically connected to each other by the encapsulant.

25. The semiconductor device of claim 24, further including a substrate, wherein the plurality of semiconductor die is mechanically connected to the substrate by the solder cap.

* * * * *